United States Patent [19]

Chandra et al.

[11] Patent Number: 5,230,001
[45] Date of Patent: Jul. 20, 1993

[54] METHOD FOR TESTING A SEQUENTIAL CIRCUIT BY SPLICING TEST VECTORS INTO SEQUENTIAL TEST PATTERN

[75] Inventors: Susheel J. Chandra, Fremont; Tushar Gheewala, Cupertino, both of Calif.

[73] Assignee: CrossCheck Technology, Inc., San Jose, Calif.

[21] Appl. No.: 666,538

[22] Filed: Mar. 8, 1991

[51] Int. Cl.$^5$ .................. G01R 31/28; G06F 11/00
[52] U.S. Cl. ................................ 371/27; 364/488
[58] Field of Search ............... 364/488, 489; 324/73.1; 371/27, 22.3

[56] References Cited

U.S. PATENT DOCUMENTS

| | | | |
|---|---|---|---|
| 3,761,675 | 9/1973 | Mason et al. | 219/121.67 |
| 3,795,859 | 3/1974 | Benante et al. | 371/21.4 |
| 3,806,891 | 4/1974 | Eichelberger et al. | 395/275 |
| 4,293,919 | 10/1981 | Dasgupta et al. | 364/716 |
| 4,513,418 | 4/1985 | Bardell, Jr. et al. | 371/22.3 |
| 4,517,672 | 5/1985 | Pfleiderer et al. | 371/27 |
| 4,602,210 | 7/1986 | Fasang et al. | 371/22.3 |
| 4,613,970 | 9/1986 | Masuda et al. | 371/22.3 |
| 4,749,947 | 6/1988 | Gheewala | 340/825.79 |
| 4,833,676 | 5/1989 | Koo | 371/22.3 |
| 4,857,774 | 8/1989 | El-Ayat et al. | 307/465 |
| 4,937,826 | 6/1990 | Gheewala et al. | 371/22.1 |
| 5,010,552 | 4/1991 | Dias et al. | 371/27 |
| 5,065,090 | 11/1991 | Gheewala | 371/25.1 |

FOREIGN PATENT DOCUMENTS 0223714 5/1987 European Pat. Off. .

OTHER PUBLICATIONS

"Design for Testability—A Survey", by T. W. Williams, et al., *Proceedings IEEE*, vol. 71, pp. 359–416, Jan. 1983.

"A Logic Design Structure for LSI Testability", Eichelberger, et al., *Proceedings 14th Design Automation Conf.*, Jun. 1977.

"Built-in Self-Test Techniques" by E. J. McClusky, *IEEE Design and Test*, vol. 2, No. 2, pp. 21–28, Apr. 1985.

"Built-in Self-Test Structures" by E. J. McClusky, *IEEE Design and Test*, vol. 2, No. 2, pp. 29–36, Apr. 1985.

"Voltage Checking Device" by G. Canard and A. Potocki, *IBM Technical Disclosure Bulletin*, vol. 8, No. 5, Oct. 1965.

*Primary Examiner*—Thomas G. Black
*Assistant Examiner*—Michael Zanelli
*Attorney, Agent, or Firm*—Townsend and Townsend Khourie and Crew

[57] ABSTRACT

During application of a sequence of design verification patterns at the primary input pins of a sequential circuit IC, a test vector is spliced between patterns to test for a fault condition. As design verification patterns are applied in sequence, the state of the sequential circuit changes. To test for a select fault condition, the sequential circuit needs to be in a desired state. While in such desired state, a test vector is applied and select internal circuit element responses are monitored. If the desired state occurs during a sequence of design verification patterns, then the test vector is applied between successive patterns before the IC clock has a transition. By applying the test signal, monitoring the response, then reapplying the design verification pattern before the clock changes, the IC subsequent state which would occur had the test vector been omitted still occurs. If a desired state does not occur during the sequence of design verification patterns, then a select state similar to the desired state is identified. When such select state occurs, control signals are applied through internal test points to force a state change to the desired state. Thereafter, the appropriate test vector is applied and the response is monitored to check the fault condition. All such steps occur before a clock transition so that the state and design verification pattern occurring at the beginning of the clock cycle, also occur before the next transition to the clock cycle. Accordingly, the design verification pattern sequence is not invalidated.

5 Claims, 4 Drawing Sheets

METHOD FOR TESTING A SEQUENTIAL CIRCUIT BY SPLICING TEST VECTORS INTO SEQUENTIAL TEST PATTERN

CROSS REFERENCE TO RELATED APPLICATION

This invention is related to commonly-assigned U.S. Pat. No. 4,749,947 issued Jun. 7, 1988 for GRID-BASED, "CROSS-CHECK" TEST STRUCTURE FOR TESTING INTEGRATED CIRCUITS; commonly-assigned U.S. patent application Ser. No. 554,313, filed Jul. 17, 1990 and issued as U.S. Pat. No. 5,157,627 on Oct. 20, 1992 for METHOD AND APPARATUS FOR SETTING DESIRED SIGNAL LEVEL ON STORAGE ELEMENT; commonly-assigned U.S. patent application Ser. No. 601,969 filed Oct. 23, 1990 and issued as U.S. Pat. No. 5,179,534 on Jan. 12, 1993 for METHOD AND APPARATUS FOR SETTING DESIRED LOGIC STATE AT INTERNAL POINT OF A SELECT STORAGE ELEMENT and commonly-assigned U.S. patent application Ser. No. 482,458 filed Feb. 20, 1990 and issued as U.S. Pat. No. 4,975,640 on Dec. 4, 1990 for METHOD FOR OPERATING A LINEAR FEEDBACK SHIFT REGISTER AS A SHIFT REGISTER WITH A CROSSCHECK GRID STRUCTURE. The contents of such patent and patent applications are incorporated herein by reference in their entirety, and made a part hereof.

BACKGROUND OF THE INVENTION

This invention relates to a method for testing a sequential circuit by applying a test vector of test signals to primary input pins, while the sequential circuit is in a known state. More particularly, this invention relates to a method for testing a sequential circuit by splicing a test vector between input vectors while the circuit is in a desired state.

A sequential circuit IC is characterized by the many layers of internal circuits. An input signal at a primary pin causes sequential responses from various internal circuits. Testing of sequential circuits having several hundred or more gates, including counters, shift registers and asynchronous elements is a problem due to the difficulty in isolating internal circuit elements.

Test points typically are provided for accessing internal circuits. However, as test contacts are relatively large compared to a circuit element, there is a limited number of test contacts for accessing an IC. Accordingly, complex ICs often are designed with internal test circuitry which accommodates extensive testing Such internal test circuitry may include shift registers which receive test signal patterns to be shifted out of the register to various test points. Accordingly, one or more external pins are used for entering test signals to such shift registers for being relayed to multiple internal test points.

Such an approach is commonly referred to as SCAN. See "Design For testability—A Survey" by T. W. Williams and K. P. Parker, *Proceedings IEEE*, Vol. 71, pp. 98-112, January 1983; and "A Logic Design Structure For LSI Testing" by E. B. Eichelberger and T. W. Williams, *Proceedings 14th Design Automation Conference*, June 1977 77CH1216-1C, pp. 462-468. Also see "Built-in Self-Test Techniques" and "Built-in Self-Test Structures" by E. J. McCluskey, *IEEE Design and Test*, Vol. 2, No. 2, pp. 437-452. Also see U.S. Pat. Nos. 3,806,891 (Eichelberger et. al.); 3,761,675; 4,293,919 (Dasgupta et. al.) and 4,513,418 (Bardell, Jr. et. al.) assigned to the IBM Corporation which disclose the serial connection of flip-flops into a shift register to allow access to them through "fewer" test points.

According to the SCAN approach, the integrated circuit is designed to tie select storage elements (e.g., test points) to one or more shift register chains. The shift registers are loaded through test contacts or through the primary input pins during a test, enabling the desired logic states to be loaded to the select storage elements. Thus, the test signals are generated off-chip and multiplexed to the appropriate test point.

Other approaches for defining test signals and monitoring internal IC components are described in U.S. Pat. No. 4,613,970 for INTEGRATED CIRCUIT DEVICE AND METHOD OF DIAGNOSING THE SAME; EPO patent publication number 223 714A2 for SEMICONDUCTOR INTEGRATED CIRCUIT DEVICE WITH TEST CIRCUIT; U.S. Pat. No. 4,517,672 for METHOD AND ARRANGEMENT FOR AN OPERATIONAL CHECK OF A PROGRAMMABLE LOGIC ARRAY; IBM Technical Disclosure Bulletin Vol. 8, no. 5 October 1965, "Voltage Checking Device" by G. Canard and A. Potocki; and U.S. Pat. No. 3,795,859 for METHOD AND APPARATUS FOR DETERMINING THE ELECTRICAL CHARACTERISTICS OF A MEMORY CELL HAVING FIELD EFFECT TRANSISTORS.

One problem for generating tests for sequential circuits is the difficulty in initializing the states of the internal memory elements to a certain combination so that a test vector can be applied to test for a given fault condition.

SUMMARY OF THE INVENTION

According to the invention, a test vector is spliced or interposed between design verification patterns at a time when the sequential circuit defines a desired state. A design verification pattern is a vector of input signals applied at a given time to the primary input pins of a sequential circuit. As successive design verification patterns are applied, the internal elements of the sequential circuit undergo storage state transitions. At any given time, the states of the internal elements define a sequential circuit state. When the sequential circuit is in a desired state, a test vector is spliced between successive design verification patterns to test for a particular fault condition. To properly test the fault condition, the sequential circuit must be in a specific state (e.g., the "desired" state). Thus, by generating a specific test vector while the sequential circuit is in the desired state, one or more internal circuit elements may be isolated so as to test for a particular fault condition.

According to one aspect of the invention, a test vector is interposed at the primary input pins between successive design verification patterns to check for the particular fault condition at a time when successive design verification patterns produce the desired state.

According to another aspect of the invention, the clock signals for the sequential circuit are held unchanged during application of the test vector. Once the fault condition is tested, the test vector then is replaced with the previous input vector (which defines the prior design verification pattern). Because the clock is unchanged during the application of the test vector and re-application of the prior input vector, the input vector returns the sequential circuit state to the pre-test vector state (e.g., the desired state during which the test vector is applied). The sequential circuit clock signals then resume. As a result, the known occurrence of states caused by the design verification patterns occurs without impact. Additional states, however, are interposed, then removed. Thus, the test vector changes the desired state. The desired state then re-occurs when the test vector is removed and the pre-test input vector is re-applied.

According to another aspect of the invention, a desired state is forced on a sequential circuit when such desired state does not occur in response to successive design verification patterns. The desired state is forced by identifying a known state which occurs in response to the design verification patterns. The particular known state is selected to be a state which is similar to the desired state (i.e., same state except for the state of a few memory elements). During the similar state, the sequential circuit clocks are held. While the clock signals are held, control signals are applied through an integral test structure to alter the appropriate memory elements so as to define the desired sequential circuit state. The appropriate test vector then is applied to test for the particular fault condition. The altered memory elements then are forced back to their original states and the original pre-test input vector is re-applied. Once the pre-test input vector and pre-test "desired" state are re-instated, then the sequential circuit clocks resume. Because the clocks are unchanged during the state modification and vector splicing, the state of the sequential circuit returns to the pre-test "desired" state. Accordingly, subsequent design verification patterns put the sequential circuit through the expected state changes.

DESCRIPTION OF SPECIFIC EMBODIMENTS

Design Verification Patterns

To verify the design of a complex sequential circuit IC, a sequence of input signals is applied to respective primary input pins of an IC. The pattern of input signals being applied at a given time is referred to as an input vector. By applying appropriate input vectors in sequence and monitoring the primary output pins, design verification is performed. Each input vector applied for design verification is also referred to as a design verification pattern $D_n$.

Figure 1:
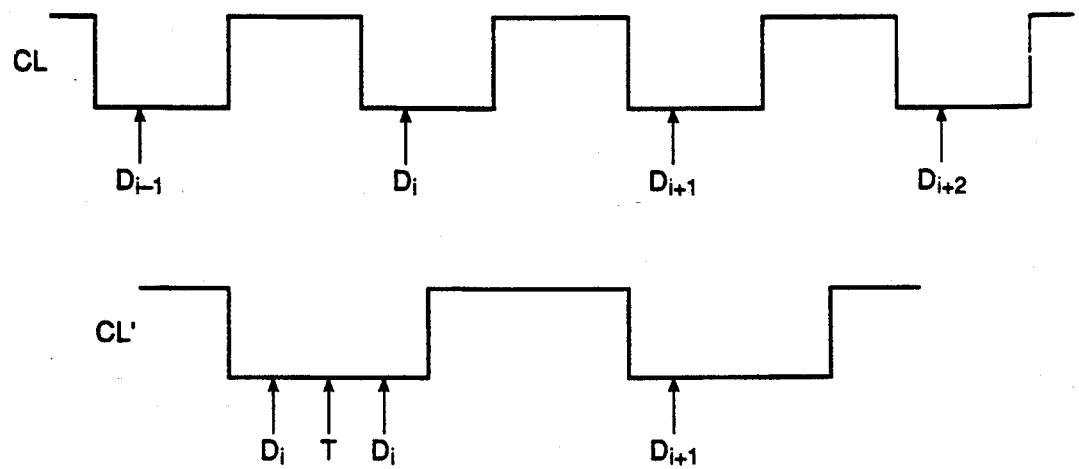
FIG. 1 is a chart of the clock signal depicting the interposing of a test vector.

FIG. 1 shows a clock signal CL for a sequential circuit IC. During sequential low levels of the clock signal CL, successive design verification patterns D are applied to the primary input pins of the sequential circuit IC. During the course of design verification, the sequential circuit defines varying states. The "state" of the sequential circuit is defined by the logic states stored in the respective internal elements of the sequential circuit. As different design verification patterns D are applied in sequence, the contents of the internal elements change. Thus, the sequential circuit state changes.

By monitoring the changes which occur in response to a primary input vector while the sequential circuit is in a given state, one or more fault conditions also are checked.

Figure 2:
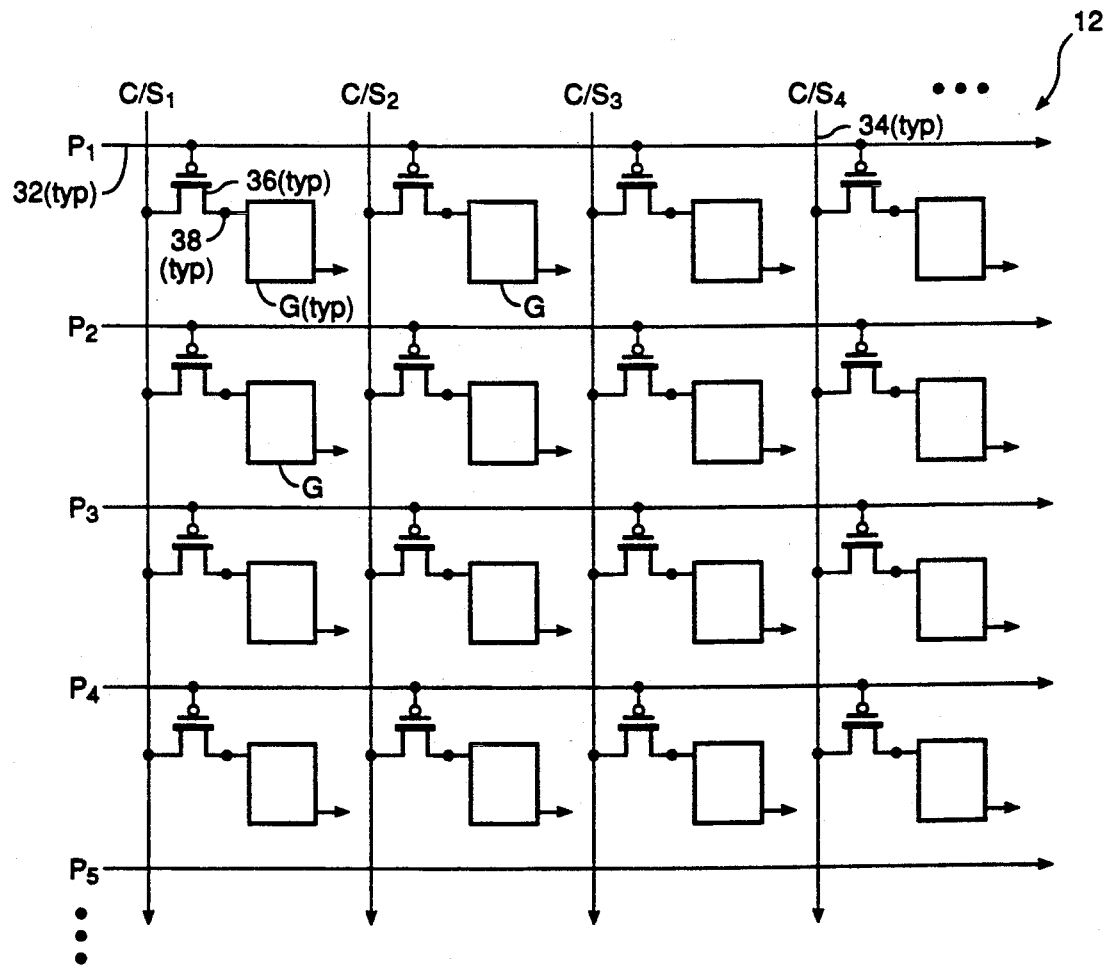
FIG. 2 is a schematic diagram of a test-point array coupled to internal elements G of the sequential circuit IC.

Referring to FIG. 2, internal elements G of the sequential circuit 12 may be monitored by addressing specific elements G with probe lines $P_x$ while sensing the logic level at corresponding control/sense lines $C/S_x$. Thus, during the course of design verification, many fault conditions may be checked. In the presence of massive observability, such as that provided by an embedded grid structure type array of FIG. 2, design verification patterns check many potential fault conditions. However, because the design verification patterns are not designed for testing all fault conditions, some faults still may remain undetected.

Vector Splicing

To test for a particular fault condition the sequential circuit is initialized to a desired state. If such state is one of the known states occurring during the application of successive design verification patterns, then the test vector T is spliced or interposed between two design verification patterns $D_i$, $D_{i+1}$ during a time period during which the sequential circuit clock signal does not undergo a transition. Thus, the clock signal may be held, or the splicing and monitoring may occur before a clock transition. As shown in curve CL', a test vector T is applied in place of the pattern $D_i$ while the clock signal is low. After the fault condition is monitored, the test vector is removed and the pattern $D_i$ is re-applied before the clock goes through a level transition.

The test signals forming the test vector T are applied to the primary input pins of the IC to exercise the particular fault condition once the desired state occurs. Appropriate circuit elements G are monitored during such application to detect a response so as to identify whether the fault condition is present.

If the desired state is not one of the known states occurring during the design verification patterns, then the desired state is forced on the sequential circuit. To force the desired state, a known state similar to the desired state is first identified. Preferably, the selected state is different from the desired state by only a few gates or less. When the selected state occurs, control signals are applied to the appropriate internal elements G to change their logic levels to the appropriate logic levels which put the sequential circuit into the desired state. While in the desired state, a test vector is applied to the primary inputs pins. Appropriate circuit elements G are monitored during such test vector application to detect a response and identify whether the fault condition is present. Thereafter, the pre-splicing design verification pattern replaces the test vector and the previously modified circuit elements G are re-modified to their prior logic states. During such state changes and vector splicing, the sequential circuit clock does not undergo a transition. Thus, when the design verification pattern is re-applied, the changes caused by the vector splicing return to the pre-splicing logic levels. Because the elements G modified by the control signals are forcibly re-modified back to the pre-state change logic levels, the sequential circuit state returns to the select state. Thereafter, the sequential circuit clock undergoes transition and the design verification patterns continue.

Figure 3:
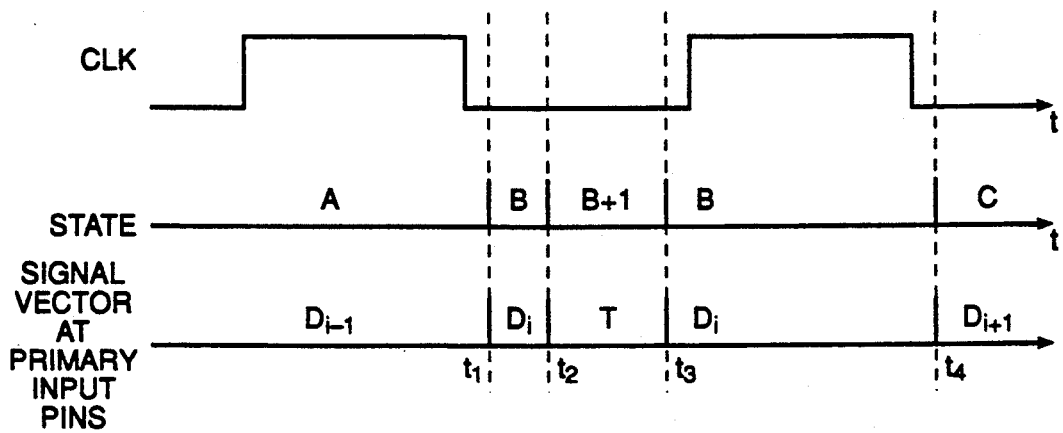
FIG. 3 is a timing diagram for splicing a test vector during a known sequential circuit state according to an embodiment of this invention.
Figure 4:
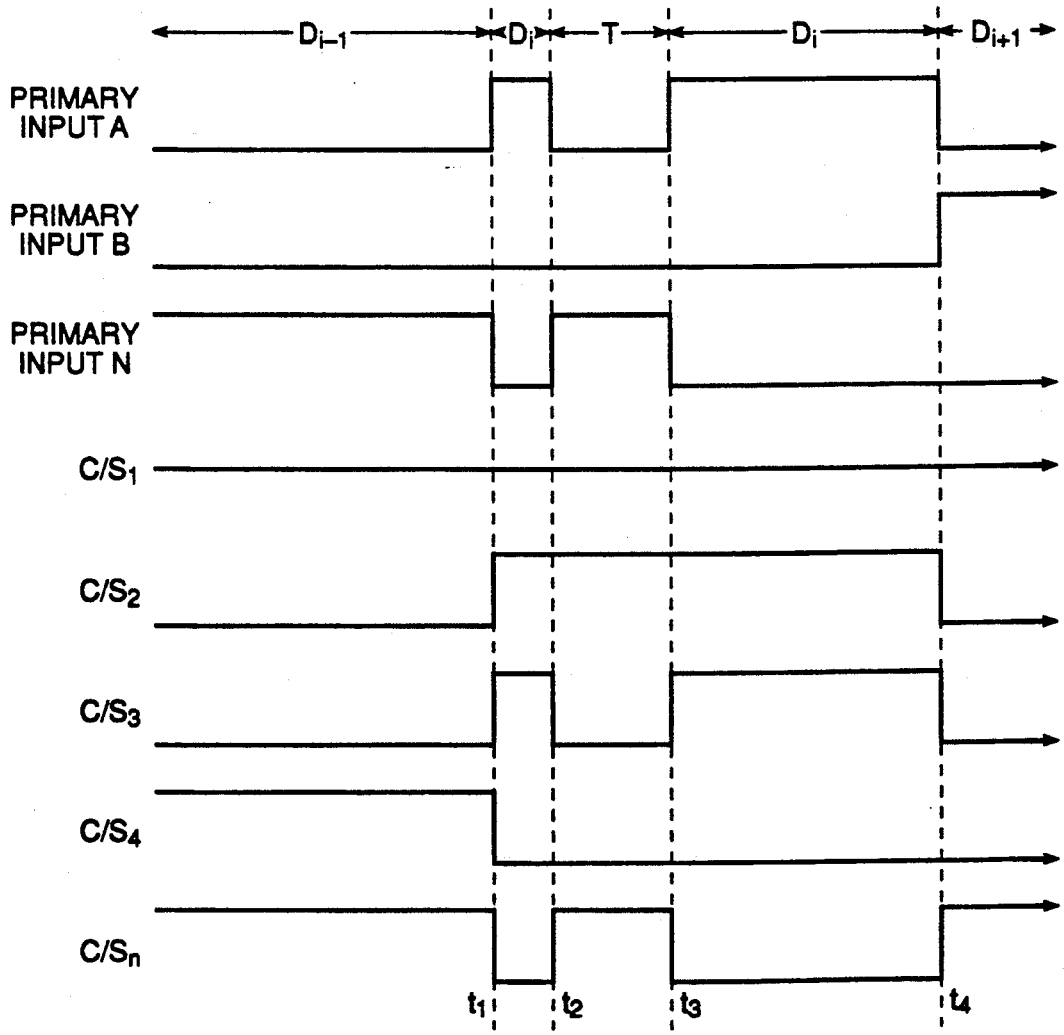
FIG. 4 is a timing diagram of the signal vector applied at primary input pins and of the control-sense lines of the test structure for the timing relationship of FIG. 3.

FIG. 3 shows a clock signal CLK for a sequential circuit 12. As shown in the state curve and Signal Vector curve, an input vector is received at the primary pins during each low level portion of the clock signal CLK. Initially, the input vector is design verification pattern $D_{i-1}$. As depicted in FIG. 4, such pattern includes a logic low at primary input pin A, a logic low at primary input pin B, a logic high at primary input pin N, plus other component signal inputs not shown. During such pattern, the sequential circuit defines a state A as shown in the state curve of FIG. 3. Such state A is characterized in FIG. 4 by sense line signals $C/S_1$ through $C/S_n$ monitored from internal circuit elements G of the sequential circuit.

At time $t_1$, the design verification pattern changes to pattern $D_i$. As shown in FIG. 4, the logic states at primary input pins A and N change, while the logic state at pin B does not change. The sequential circuit 12 responds to the pattern $D_1$ causing a new state B to occur. State B is characterized in FIG. 4 by transitions in sense lines $C/S_2$ through $C/S_n$.

At time $t_2$, while the clock is still in a low state, the pattern $D_i$ is replaced with a test vector T. As shown in FIG. 4, the test vector T differs from the pattern $D_i$ resulting in different input signal levels applied at pins A and N. In response to the test vector T, the sequential circuit responds as indicated by the changes in sense lines $C/S_3$ and $C/S_n$ resulting in a new state $B+1$.

At time $t_3$, the test vector is replaced with the previous pattern $D_i$ causing the sense lines $C/S_3$ and $C/S_n$ to return to the previous levels. Because the clock signal has not undergone a transition, the state returns to state B. At time $t_4$, the next design verification pattern $D_{i+1}$ is applied, causing a new state C as indicated by the changes in signals $C/S_2$, $C/S_3$ and $C/S_n$. Accordingly, the test vector T is spliced between successive design verification patterns $D_i$ and $D_{i+1}$. The position of the splicing is determined by the state of the sequential circuit 12. For the fault condition to be tested, the initial state needed was state B. Once in state B, the test vector T was applied and the response monitored to check the fault condition. Thereafter, the pattern $D_i$ was re-applied to put the sequential circuit 12 back to state B for the next pattern $D_{i+1}$ to be applied.

State Change Prior To Vector Splicing

Figure 5:
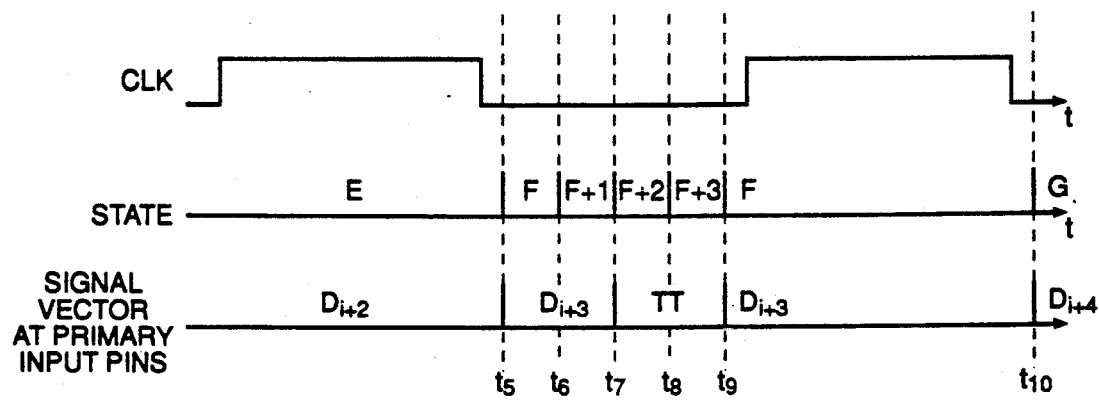
FIG. 5 is a timing diagram for forcing a desired sequential circuit state before splicing a test vector according to an embodiment of this invention.
Figure 6:
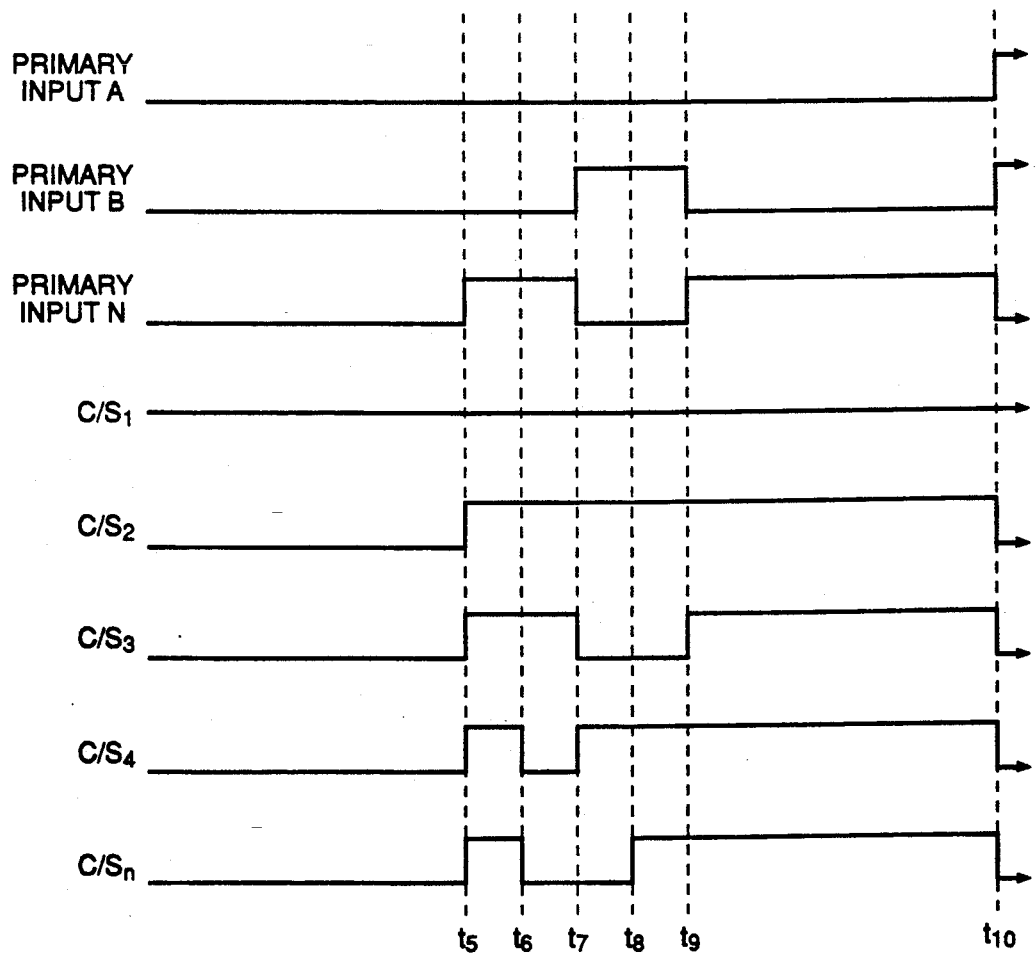
FIG. 6 is a timing diagram of the signal vector applied at primary input pins and of the control-sense lines of the test structure for the timing relationship of FIG. 5.

FIGS. 5 and 6 are timing diagrams for a test operation in which a desired state $F+1$ is forced on the sequential circuit 12. At the start of the operation, prior to the sequence, a design verification pattern $D_{i+2}$ is present causing the circuit 12 to be in state E. As shown in FIG. 6 the pattern $D_{i+2}$ is formed by low signals applied at pins A, B and N causing the state E. State E is characterized by the low outputs at select internal elements G as sensed at control-sense lines $C/S_1$ through $C/S_n$.

At time $t_5$, the pattern changes to $D_{i+3}$ causing a change to state F. The pattern $D_{i+3}$ and state F are depicted in FIG. 6 by the signals at input pins A, B and N and the signals at control-sense lines $C/S_1$ through $C/S_n$, respectively. At time $t_6$, a new state $F+1$ is forced upon the sequential circuit 12 by applying control signals through the integral test structure at lines $C/S_4$ and $C/S_n$. Now in the desired state $F+1$, the test vector TT is applied to the input pins at time $t_7$. The test vector TT changes the signals at pins B and N causing sense lines $C/S_3-C/S_n$ to switch. As a result, the circuit 12 is now in a state $F+2$. The sense lines $C/S_1-C/S_n$ are monitored during application of the test vector TT to check the fault condition.

Thereafter, the changes forced upon the internal elements G through the control lines $C/S_4$ and $C/S_n$ are undone at time $t_8$ by forcing the lines back high as shown in FIG. 6. Note that $C/S_4$ already had returned high from the test vector TT. Undoing the changes caused by the first forced state change (e.g., F to $F+1$) results in a state change back to the pre-forced state F or some other state $F+3$. The resulting state F or $F+3$ is based upon the impact of the test vector TT. If the test vector TT only changes elements which changed during the forced state change (e.g., F to $F+1$), then when the forced changes are undone, the state changes back to state F. If the test vector changes one or more elements G not changed during the forced state change, then even if the forced changes are undone, one or more of the test vector changes remain resulting in a state $F+3$.

At time $t_9$, the pattern $D_{i+3}$ replaces the test vector TT undoing the test vector change. Thus, the sequential circuit state reverts back to state F. Then, at time $t_{10}$, a new pattern $D_{i+4}$ is applied causing another state change to state G. By forcing the state change (e.g., F to $F+1$), applying the test vector TT, undoing the state changes, and removing the test vector TT during a common low level of the clock signal, the state F and input vector $D_{i+3}$ at the end of the operation are the same as the state and input vector occurring at the beginning of the operation.

Instead of undoing the state change at time $t_8$, the state $F+2$ may be used for another test, since the changes can be forced back after the subsequent test. Similarly, a test can be performed from state $F+3$ as the changes can be forced after such test. In addition, a sequence of test vectors may be applied to perform a series of tests, with the state being forced back at the end of the sequence.

Figure 7:
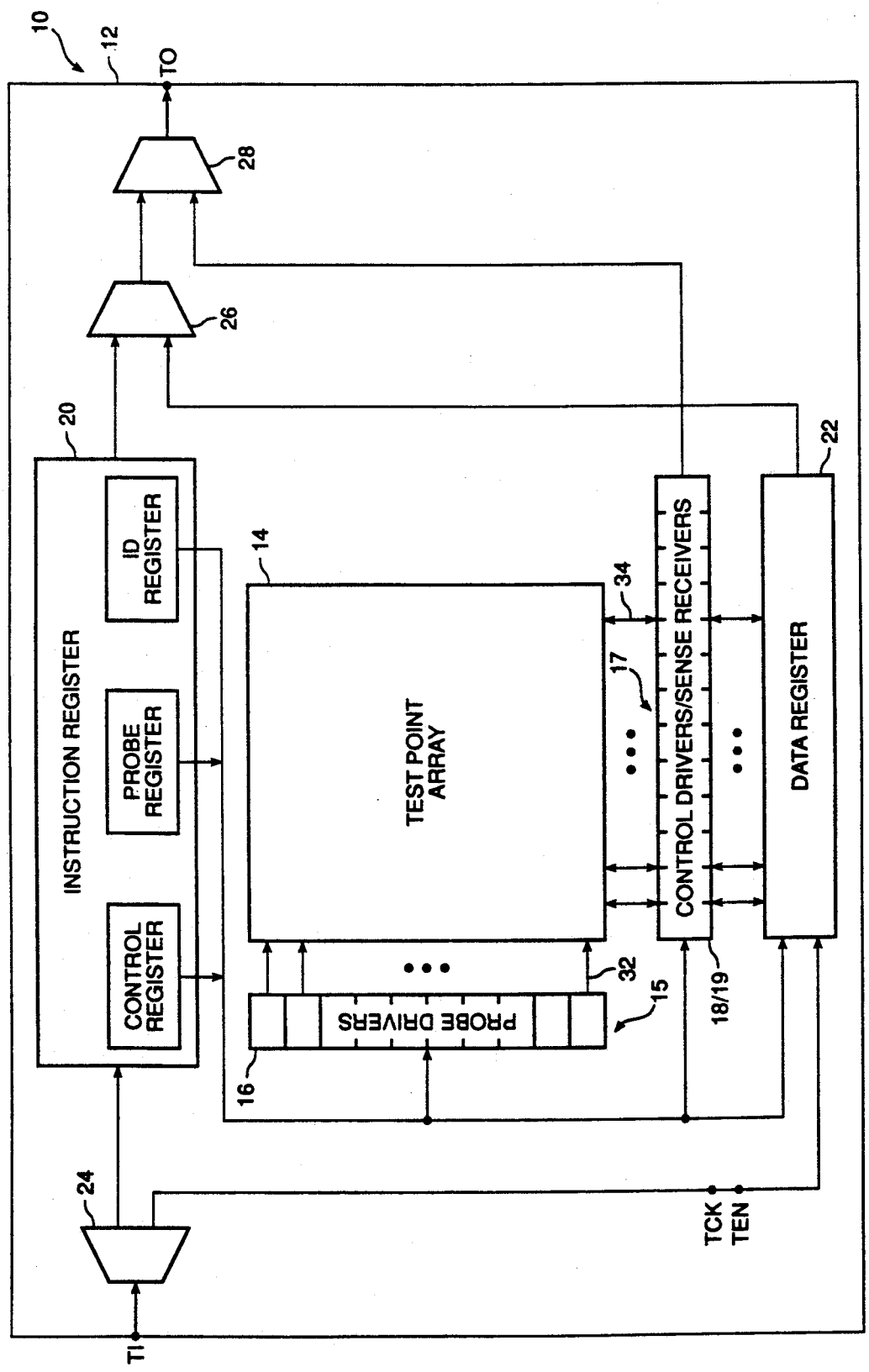
FIG. 7 is a block diagram of on-chip test circuitry for a sequential circuit IC.

Embedded Test Circuitry For Forcing a Desired State and Monitoring Internal Test Points FIG. 7 shows local test circuitry 10 residing on a sequential circuit IC 12. The test circuitry 10 includes a test point array 14, a plurality 15 of probe line drivers 16, a plurality 17 of control/sense line drivers/receivers 18, 19, an instruction register 20, a data register 22, a multiplexor 24, and demultiplexors 26, 28. The sequential circuit 12 includes external pin contacts for receiving primary input signals, a test clock signal TCK, a test enable signal TE, a test input signal TI and a test output signal TO. The function of the test circuitry 10 is to generate control signals (e.g., test signals) for select test points of the test point array 14, while monitoring resulting response signals.

The sequential circuit 12 also embodies the internal sequential circuit elements G (e.g., non-test circuitry) as shown in FIG. 2. An element G of the operational circuitry is coupled to a test point to enable monitoring and state changing of such element G. During testing, the test point is sensed and/or exercised. The local test circuitry 10 interfaces to the test points to test the sequential circuit elements G. The plurality of test points form the test point array 14.

FIG. 2 shows a test grid structure of test points 38 embodying the test point array 14. Such test grid structure is described in the commonly-assigned U.S. Pat. No. 4,749,947 issued Jun. 7, 1988 for GRID-BASED, "CROSS-CHECK" TEST STRUCTURE FOR TESTING INTEGRATED CIRCUITS. The grid structure is formed of individually accessible probe lines 32 and control/sense lines 34 with electronic switches 36 at the crossings. A probe line 32 is coupled to a switch 36 for defining the switch "ON" or "OFF" state. One conducting channel of the switch 36 is coupled to a test point 38, while another conducting channel is coupled to a control/sense line 34. Each control/sense line 34 is coupled to a sense receiver and control driver. When the sense driver 18 is inactive, the line 34 functions as a sense line for monitoring a response signal from the test point 38. When the driver 18 is active, the line 34 functions as a control line along which a control signal is conducted toward a test point 38. Activating a select switch 36 through a corresponding probe line 32 enables a test point 38 to be sensed or controlled.

Methods for controlling the test point signal level are described in commonly-assigned U.S. patent application Ser. No. 554,313 filed Jul. 17, 1990 for METHOD AND APPARATUS FOR SETTING DESIRED SIGNAL LEVEL ON STORAGE ELEMENT and commonly-assigned U.S. patent application Ser. No. 601,969 filed Oct. 23, 1990 for METHOD AND APPARATUS FOR SETTING DESIRED LOGIC STATE AT INTERNAL POINT OF A SELECT STORAGE ELEMENT.

According to one aspect of this invention, control signals are applied to internal logic elements G through a corresponding test point 38 to modify the state of such element G (and thus of the sequential circuit 12). Control signals are applied to select test points 38 and response signals are sensed from other select test points 38. To apply a control signal to a select test point 38, the instruction register 20 is loaded by external test electronics (not shown). The instruction register 20 in response activates a select probe line driver 16 and enables an appropriate control driver/sense receiver 18, 19 to function as a driver. The control signal then is read from a corresponding bit of the data register 22, and fed through the driver 18 and a switch 36 to the select test point 38.

To sense a response signal from a select test point 38, the instruction register 20 activates a select probe line driver 16 and sets an appropriate control driver/sense receiver 18, 19 to receiver. The response signal then is read from the select test point 38 through switch 36 into receiver 19 and data register 22 at a corresponding register bit.

The steps of driving a control signal and monitoring a response signal at different test points are accomplished with one or more instructions loaded into instruction register 20. A first instruction may activate a first probe line driver 16 and first control line driver 18, while a second instruction activates a second probe line driver 16 and second sense line receiver 19.

A response signal may be read at the IC test output signal TO by defining a path between a sense line receiver 19 and the output terminal TO. The path is formed by selecting demultiplexor 28 to channel the response signal from the sense line receivers 19. Alternatively, a path may be formed by selecting demultiplexor 26 to channel the data register 22 contents and selecting demultiplexor 28 to channel the signal from the demultiplexor 26. Signals (not shown) are input to demultiplexors 26, 28 from the instruction register 20 for selecting the channel which defines the output signal. Accordingly, the response signal of the addressed test point 38 appears at the terminal TO.

Conclusion

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. A method for testing a sequential circuit embodied in an integrated circuit, the integrated circuit having a plurality of primary input pins and an embedded test structure, a sequence of design verification patterns being applied to the primary input pins, a design verification pattern being a plurality of input signals applied to respective primary input pins, the sequential circuit receiving a clock signal and having a plurality of circuit elements clocked by said clock signal, a sequential circuit fault condition being tested while the sequential circuit is in a prescribed state, the method comprising the steps of:

identifying a first fault condition not tested by the sequence of design verification patterns, the first fault condition requiring a first prescribed state;

identifying a first design verification pattern which causes said first prescribed state;

while said sequential circuit is in said first prescribed state, applying a first test vector of test input signals to the primary input pins;

monitoring select sequential circuit elements during application of said first test vector to test for said first fault condition; and replacing said first test vector with said first design verification pattern after said steps of applying and monitoring;

said steps of applying, monitoring and replacing occurring without a level transition by said clock signal.

2. The method of claim 1, further comprising the steps of:

identifying a second fault condition not tested by the sequence of design verification patterns, the second fault condition requiring a second prescribed state;

selecting a second design verification pattern and a corresponding sequential circuit state;

while said second design verification pattern is applied and said sequential circuit is in said corresponding state, applying at least one control signal to the test structure to alter said corresponding state to said second prescribed state;

while in said second prescribed state, applying a second test vector to the primary input pins;

monitoring select sequential circuit elements during application of said second test vector to test for said second fault condition;

undoing the changes to the sequential circuit caused by said step of applying at least one control signal, said step of undoing comprising the step of generating at least one additional control signal to the test structure to modify one or more sequential circuit element storage values; and thereafter, replacing said second test vector with said second design verification pattern;

said sequential circuit returning to said corresponding state after said steps of undoing and replacing;

said further steps of control signal applying, second test vector applying, monitoring, undoing and replacing occurring without a level transition by said clock signal.

3. A method for testing a sequential circuit embodied in an integrated circuit, the integrated circuit having a plurality of primary input pins and an embedded test structure, a sequence of design verification patterns being applied to the primary input pins, a design verification pattern being a plurality of input signals applied to respective primary input pins, the sequential circuit receiving a clock signal and having a plurality of circuit elements clocked by said clock signal, a sequential circuit fault condition being tested while the sequential circuit is in a prescribed state, the method comprising the steps of:

identifying a first fault condition not tested by the sequence of design verification patterns, the first fault condition requiring a first prescribed state;

identifying a first design verification pattern which causes said first prescribed state;

while said sequential circuit is in said first prescribed state, applying a sequence of test vectors to the primary input pins;

monitoring select sequential circuit elements during application of said test vectors to test for a fault condition; and re-applying said first design verification pattern after said steps of applying and monitoring;

said steps of applying, monitoring and replacing occurring without a level transition by said clock signal.

4. A method for testing a sequential circuit embodied in an integrated circuit, the integrated circuit having a plurality of primary input pins and an embedded test structure, a sequence of design verification patterns being applied to the primary input pins, a design verification pattern being a plurality of input signals applied to respective primary input pins, the sequential circuit receiving a clock signal and having a plurality of circuit elements clocked by said clock signal, a sequential circuit fault condition being tested while the sequential circuit is in a prescribed state, the method comprising the steps of:

identifying a second fault condition not tested by the sequence of design verification patterns, the second fault condition requiring a second prescribed state;

for a second prescribed state which does not occur in response to a design verification pattern, selecting a second design verification pattern and a corresponding sequential circuit state;

while said second design verification pattern is applied and said sequential circuit is in said corresponding state, applying at least one control signal to the test structure to modify said corresponding state to said second prescribed state;

while in said second prescribed state, applying a second test vector to the primary input pins; and monitoring select sequential circuit elements during application of said second test vector to test for said second fault condition.

5. The method of claim 4 further comprising the steps:

undoing the changes to the sequential circuit caused by said step of applying at least one control signal, said step of undoing comprising the step of generating at least one additional control signal to the test structure to modify one or more sequential circuit element storage values; and thereafter, re-applying said second design verification pattern to said primary input pins;

said sequential circuit returning to said corresponding state after said steps of undoing and replacing;

said steps of control signal applying, test vector applying, monitoring, undoing and replacing occurring without a level transition by said clock signal.

* * * * *